(12) United States Patent
Wada et al.

(10) Patent No.: US 7,557,400 B2
(45) Date of Patent: Jul. 7, 2009

(54) SEMICONDUCTOR *DEVICE IN* WHICH *CAPACITANCE OF* A MOS CAPACITOR IS COMPLEMENTED WITH THE CAPACITANCE OF A WIRING CAPACITOR (75) Inventors: Osamu Wada, Yokohama (JP); Hiroaki Nakano, Yokohama (JP); Hiroshi Ito, Yokohama (JP); Toshimasa Namekawa, Tokyo (JP); Atsushi Nakayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 11/670,605

(22) Filed: Feb. 2, 2007

(65) Prior Publication Data

US 2007/0181918 A1 Aug. 9, 2007

(30) Foreign Application Priority Data

Feb. 3, 2006 (JP) .............................. 2006-026782

(51) Int. Cl.
*H01L 27/108* (2006.01)
*H01L 29/00* (2006.01)
(52) U.S. Cl. .................. 257/312; 257/307; 257/532
(58) Field of Classification Search ................. 257/299, 257/300, 307, 309, 312, 379, 532, 534, E29.344, 257/E29.345, E27.049, E21.364
See application file for complete search history.

(56) References Cited

U.S. PATENT DOCUMENTS 6,037,622 A * 3/2000 Lin et al. ..................... 257/299

6,693,316 B2 2/2004 Tanaka et al.
2006/0024905 A1 * 2/2006 He et al. ..................... 438/396

FOREIGN PATENT DOCUMENTS

JP 2002-217304 8/2002

* cited by examiner

*Primary Examiner*—Hung Vu
(74) *Attorney, Agent, or Firm*—Oblon, Spivak, McClelland, Maier & Neustadt, P.C.

(57) ABSTRACT

A semiconductor device has a MOS capacitor in which a drain region and a source region of a MOS structure are commonly connected, and a capacitance is formed between the commonly connected drain region/source region and a gate electrode of the MOS structure; and a wiring capacitor which has a first comb-shaped wiring that is formed on said MOS capacitor through an interlayer insulating film, is connected to the gate electrode of said MOS capacitor, and has projecting portions projecting like comb teeth and a second comb-shaped wiring that is formed on said MOS capacitor through the interlayer insulating film, is arranged across an inter-line insulating film from the first comb-shaped wiring, is connected to the drain region and source region, and has projecting portions projecting like comb teeth, wherein the projecting portions of the second comb-shaped wiring are arranged alternately with the projecting portions of the first comb-shaped wiring and arranged perpendicularly to a channel direction connecting the drain region and source region of said MOS capacitor.

12 Claims, 7 Drawing Sheets

SEMICONDUCTOR DEVICE IN WHICH CAPACITANCE OF A MOS CAPACITOR IS COMPLEMENTED WITH THE CAPACITANCE OF A WIRING CAPACITOR

CROSS-REFERENCE TO RELATED APPLICATION

This application is based upon and claims the benefit of priority from the prior Japanese Patent Application No. 2006-26782, filed on Feb. 3, 2006, the entire contents of which are incorporated herein by reference.

BACKGROUND OF THE INVENTION

1. Field of the Invention

The present invention relates to a semiconductor device including a MOS capacitor formed on a semiconductor substrate.

2. Background Art

Conventional examples of a capacitor element formed on a semiconductor substrate include a MOS capacitor, PIP (Polysilicon-Insulator-Polysilicon) capacitor, and MIM (Metal-Insulator-Metal) capacitor. A PIP capacitor and MIM capacitor each use a material with a higher dielectric constant for a dielectric layer between electrodes.

In some cases, the material may increase the number of manufacturing processes or the process cost. For this reason, a MOS capacitor is often used in a circuit fabricated by a CMOS process, in consideration of compatibility with other components such as a MOS transistor.

Some of conventional MOS capacitors include a p-type semiconductor substrate, an n-type well formed in the p-type semiconductor substrate, an $n^+$ diffusion layer formed in the n-type well, a gate insulating film provided on the n-type well, a gate electrode made of polysilicon or a metal provided on the gate insulating film, a first metal wiring layer provided on the gate electrode and connected through a contact, and a second metal wiring layer provided on the first metal wiring layer and connected to the $n^+$ diffusion layer through a contact (see, e.g., Japanese Patent Laid-Open Publication No. 2002-217304).

With this structure, a capacitance is formed between the gate electrode and p-type semiconductor substrate across the gate insulating film, and the capacitance functions as a MOS capacitor. Since the MOS capacitor has a thin gate insulating film, it has a relatively large capacitance.

As for the CV characteristic of a MOS capacitor with the above-described MOS structure, if a gate voltage "Vg"<0, a depletion layer is formed on a silicon surface immediately below the gate electrode. A depletion layer capacitance generated by the formation of the depletion layer is series-connected to a gate insulating film capacitance. For this reason, a total capacitance "C" decreases.

On the other hand, if 0< the gate voltage "Vg," electrons floating in the n-type well are moved to the neighborhood of the silicon surface, and thus, the total capacitance "C" becomes equal to the capacitance of the gate insulating film.

As described above, a MOS capacitor has voltage dependence, i.e., the capacitance value varies with a change in applied voltage.

The CV characteristic of a MOS capacitor varies depending on whether the power supply frequency is low or high. This is because if the power supply frequency is high, switching between the on and off states of the MOS capacitor is too rapid to allow sufficient time for accumulation of carriers in an inversion layer, and the MOS capacitor is brought into a state equivalent to one when the inversion layer has no capacitance.

A MOS capacitor as described above is often used in a charge pump circuit which generates a boost power supply, and so on. A charge pump circuit is a circuit which boosts the voltage of a low-voltage power supply and supplies a high voltage to an internal circuit. A MOS capacitor used in such a charge pump circuit has voltage dependence, i.e., the capacitance value varies with a change in the voltage applied to the gate electrode. Accordingly, the boost performance of the charge pump is limited.

The voltage of a MOS capacitor constantly varies due to charge and discharge by the pumping operation of a charge pump circuit. In a channel region of the MOS capacitor, a diffusion layer or well has a high resistance. For this reason, it takes time from when an applied voltage changes to when the capacitance reaches a desired value. Thus, it is necessary to pay sufficient attention to the frequency characteristic of a MOS capacitor as well.

SUMMARY OF THE INVENTION

According one aspect of the present invention, there is provided: a semiconductor device comprising a MOS capacitor in which a drain region and a source region of a MOS structure are commonly connected, and a capacitance is formed between the commonly connected drain region/source region and a gate electrode of the MOS structure; and a wiring capacitor which has a first comb-shaped wiring that is formed on said MOS capacitor through an interlayer insulating film, is connected to the gate electrode of said MOS capacitor, and has projecting portions projecting like comb teeth and a second comb-shaped wiring that is formed on said MOS capacitor through the interlayer insulating film, is arranged across an inter-line insulating film from the first comb-shaped wiring, is connected to the drain region and source region, and has projecting portions projecting like comb teeth, wherein the projecting portions of the second comb-shaped wiring are arranged alternately with the projecting portions of the first comb-shaped wiring and arranged perpendicularly to a channel direction connecting the drain region and source region of said MOS capacitor.

According second aspect of the present invention, there is provided: a charge pump circuit comprising semiconductor devices each comprising a MOS capacitor in which a drain region and a source region of a MOS structure are commonly connected, and a capacitance is formed between the commonly connected drain region/source region and a gate electrode of the MOS structure and a wiring capacitor which has a first comb-shaped wiring that is formed on the MOS capacitor through an interlayer insulating film, is connected to the gate electrode of the MOS capacitor, and has projecting portions projecting like comb teeth and a second comb-shaped wiring that is formed on the MOS capacitor through the interlayer insulating film, is arranged across an inter-line insulating film from the first comb-shaped wiring, is connected to the drain region and source region, and has projecting portions projecting like comb teeth, the projecting portions of the second comb-shaped wiring being arranged alternately with the projecting portions of the first comb-shaped wiring and arranged perpendicularly to a channel direction connecting the drain region and source region of the MOS capacitor; an input MOS transistor having a source region connected to an input terminal to which a power supply voltage is applied; and a plurality of boost MOS transistors which are series-connected between a drain region of said input MOS transistor and an output terminal from which a boosted voltage is output, wherein the first comb-shaped wirings are connected to respective source regions of said boost MOS transistors, and pulse signals which are complementary to each other are input to the second comb-shaped wirings of respective adjacent ones of said semiconductor devices.

DETAILED DESCRIPTION

A semiconductor device according to an aspect of the present invention includes, for example, a MOS capacitor and a wiring capacitor in which metal wiring layers formed on the MOS capacitor are shaped like combs, and projecting portions projecting from opposing electrodes are alternately arranged. With this structure, the semiconductor device complements the capacitance of the MOS capacitor, which varies depending on an applied voltage, with the capacitance of the wiring capacitor.

Embodiments to which the present invention is applied will be explained below with reference to the drawings.

FIRST EMBODIMENT

Figure 1:
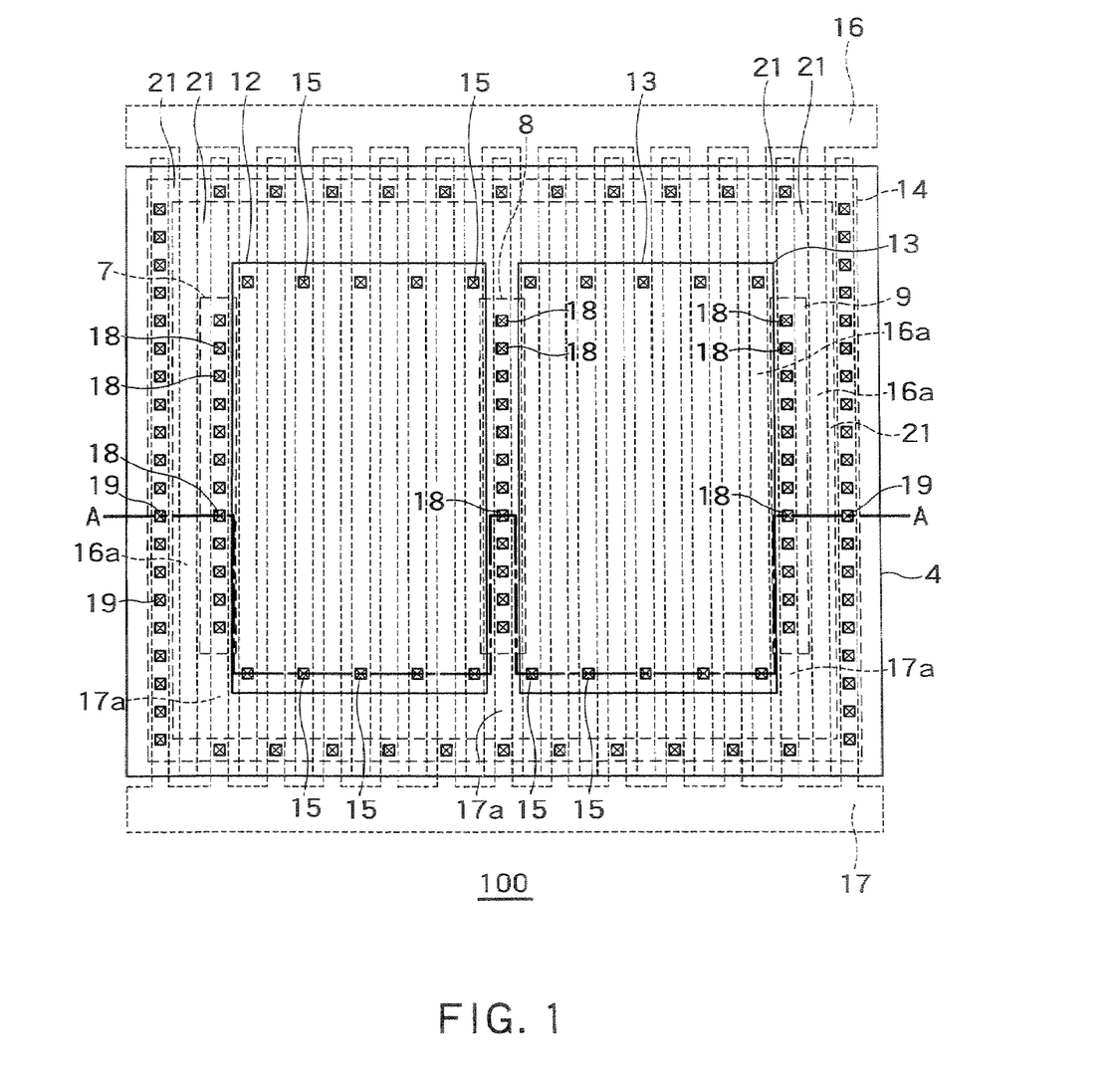
FIG. 1 is a plan view showing the configuration of the main portion of a semiconductor device according to a first embodiment of the present invention.
Figure 2:
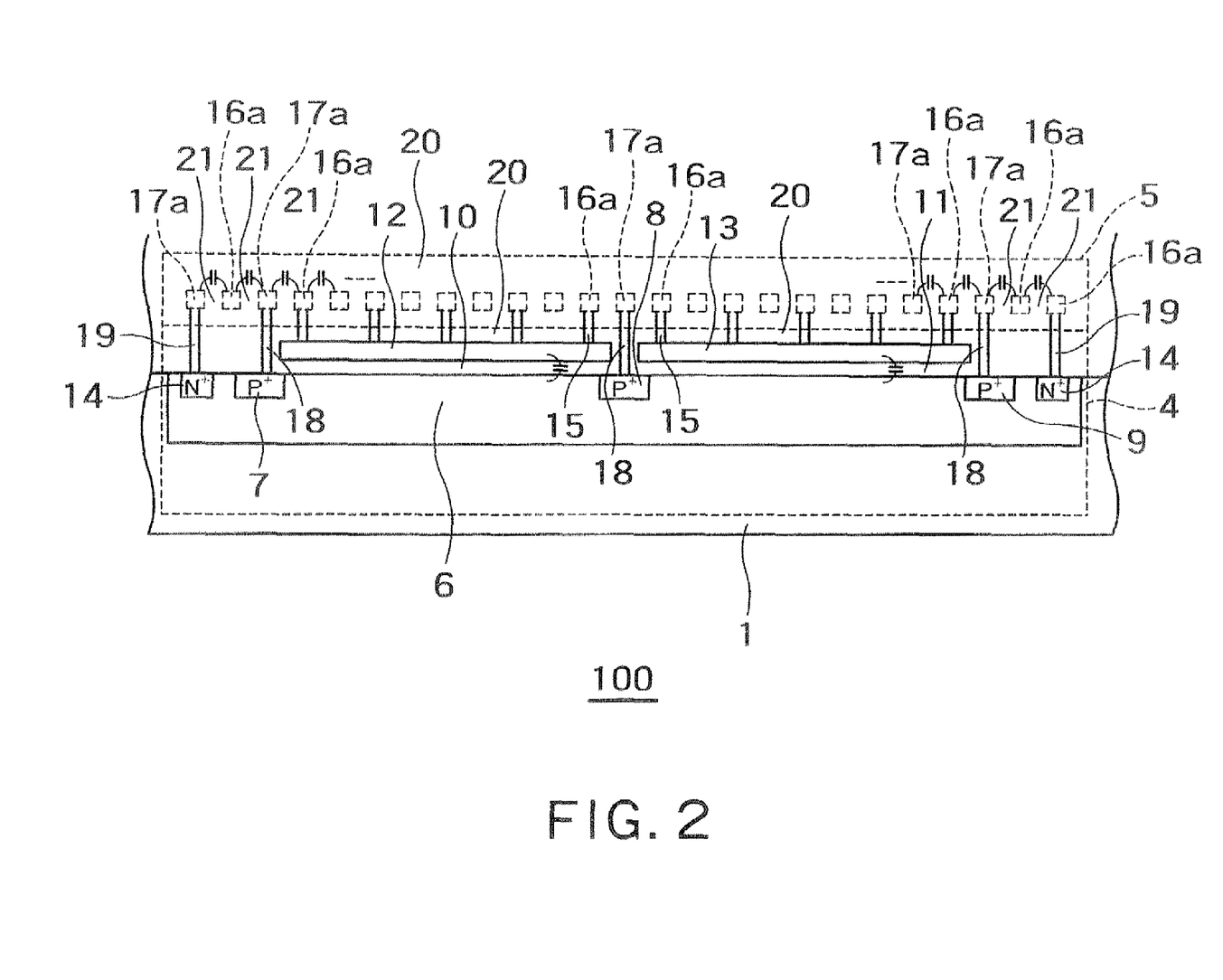
FIG. 2 is a sectional view showing a section taken along the line A-A of a semiconductor device 100 in FIG. 1.

FIG. 1 is a plan view showing the configuration of the main portion of a semiconductor device according to a first embodiment of the present invention. FIG. 2 is a sectional view showing a section taken along the line A-A of a semiconductor device 100 in FIG. 1.

An example will be explained here where a MOS capacitor is composed of two MOS structures. The case is one where the MOS capacitor is provided on a p-type semiconductor substrate. The present invention can also be applied to a circuit whose conductivity type is opposite. It suffices that the polarity of the circuit be reversed.

As shown in FIGS. 1 and 2, the semiconductor device 100 includes a MOS capacitor 4 composed of MOS structures formed on a p-type semiconductor substrate 1 and a wiring capacitor 5 provided on the MOS capacitor 4.

The MOS structures have an n-type well 6 formed on the p-type semiconductor substrate 1, $p^+$ diffusion layers 7, 8, and 9 serving as drain and source regions which are selectively formed in parallel in the surface of the n-type well 6, gate insulating films 10 and 11 provided on regions between the $p^+$ diffusion layers 7 and 8 and between the $p^+$ diffusion layers 8 and 9, gate electrodes 12 and 13 provided on the gate insulating films 10 and 11, respectively, and an n+diffusion layer 14 for applying a voltage to a back gate which is formed in the n-type well 6 so as to surround the $p^+$ diffusion layers 7, 8, and 9.

The $p^+$ diffusion layer 7 serving as the drain region of one of the MOS structures and the $p^+$ diffusion layer 8 serving as the source region are commonly connected to the MOS capacitor 4. Similarly, the $p^+$ diffusion layer 8 serving as the source region of the other MOS structure and the $p^+$ diffusion layer 9 serving as the drain region are commonly connected to the MOS capacitor 4.

The wiring capacitor 5 has a first comb-shaped wiring 16 that is formed on the MOS capacitor 4 through an interlayer insulating film 20, is connected to the gate electrodes 12 and 13 of the MOS capacitor 4 through contacts 15, and has projecting portions 16a projecting like comb teeth. The wiring capacitor 5 also has a second comb-shaped wiring 17 that is formed on the MOS capacitor 4 through the interlayer insulating film 20, is arranged across an inter-line insulating film 21 from the first comb-shaped wiring 16, is connected to the $p^+$ diffusion layers 7, 8, and 9 and the n+ diffusion layer 14 through a plurality of contacts 18 and 19, and has projecting portions 17a projecting like comb teeth. The second comb-shaped wiring 17 and the first comb-shaped wiring 16 are arranged so as to oppose each other.

The projecting portions 17a of the second comb-shaped wiring 17 and the projecting portions 16a of the first comb-shaped wiring 16 are alternately arranged. The projecting portions 17a of the second comb-shaped wiring 17 are arranged perpendicularly to a channel direction connecting the $p^+$ diffusion layer 7 serving as a drain region of the MOS capacitor 4 and the $p^+$ diffusion layer 8 serving as a source region and to a channel direction connecting the $p^+$ diffusion layer 8 serving as a source region and the $p^+$ diffusion layer 9 serving as a drain region in the same way.

As described above, the projecting portions 17a of the second comb-shaped wiring 17 and the projecting portions 16a of the first comb-shaped wiring 16 are alternately arranged through the inter-line insulating film 21. The first comb-shaped wiring 16 and the second comb-shaped wiring 17 are arranged within a single wiring layer This structure brings the projecting portions 16a of the first comb-shaped wiring 16 and the projecting portions 17a of the second comb-shaped wiring 17 closer to each other. The capacitance of the inter-line insulating film 21 between the projecting portions 16a and the projecting portions 17a can be increased.

As described above, since the projecting portions 17a of the second comb-shaped wiring 17 are arranged perpendicularly to the channel directions of the MOS capacitor 4, the projecting portions 17a of the second comb-shaped wiring 17 can be connected to the $p^+$ diffusion layers 7, 8, and 9 through the plurality of contacts 18. This makes it possible to reduce the contact resistance of each contact 18.

Figure 3:
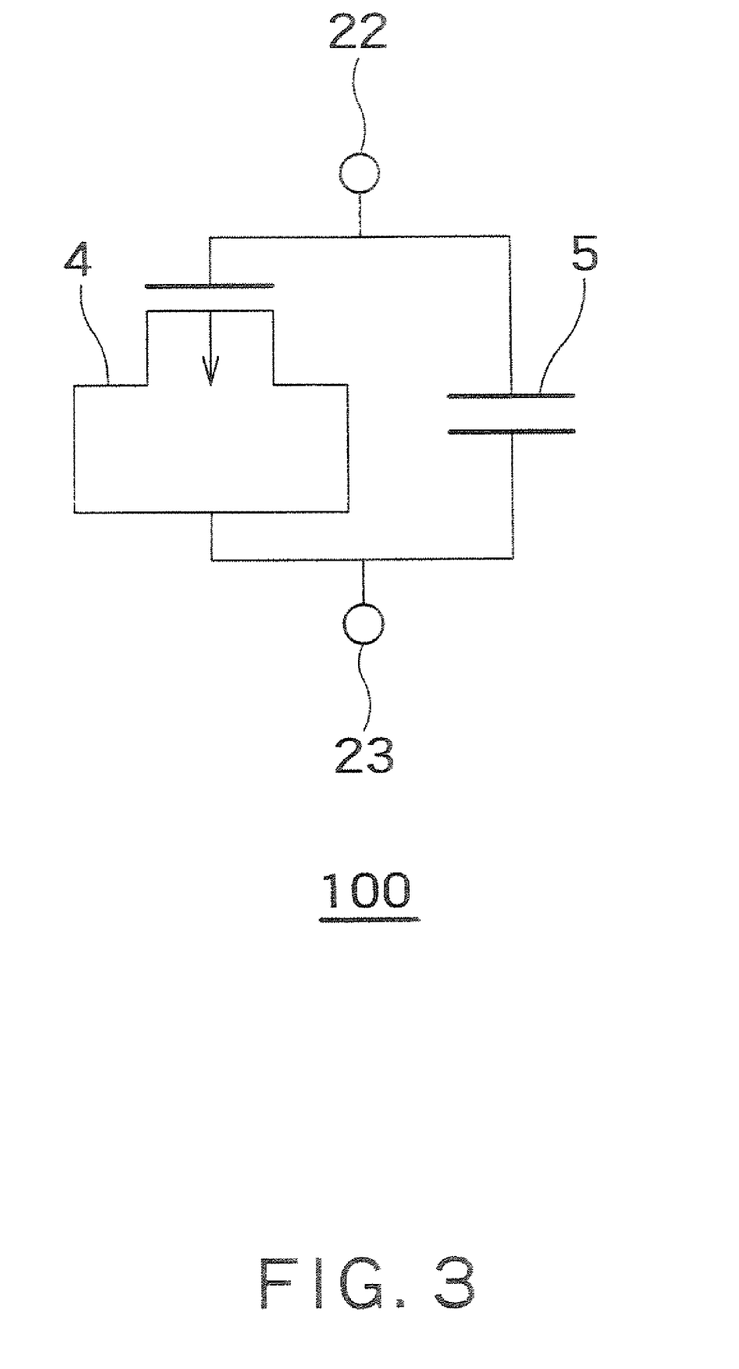
FIG. 3 is a circuit diagram of the semiconductor device according to a first embodiment of the present invention.

The circuit diagram of the semiconductor device 100 with the above-described configuration is as shown in FIG. 3. As shown in FIG. 3, the MOS capacitor 4 and wiring capacitor 5 are connected between a terminal 22 and a terminal 23 across which a desired voltage is applied.

The voltage dependence of the semiconductor device 100 with the above-described configuration will be explained here.

If a gate voltage "Vg"<0 in the MOS capacitor 4, no channel is formed. The MOS capacitor 4 is in a state called accumulation, and no depletion layer is formed. Accordingly, a capacitance "C" is almost equal to those of the gate insulating films 10 and 11. Thus, the total capacitance of the semiconductor device 100 becomes almost equal to the sum of the capacitances of the gate insulating films 10 and 11 and that of the wiring capacitor 5.

If 0< the gate voltage "Vg"< a threshold voltage "Vt" in the MOS capacitor 4, a depletion layer is formed on a silicon surface immediately below each gate electrode, and a depletion layer capacitance generated by the formation of the depletion layer is series-connected to a corresponding gate insulating film capacitance. The capacitance "C" of the MOS capacitor 4 becomes smaller than the capacitances of the gate insulating films 10 and 11. In the meantime, a capacitance formed in the wiring capacitor 5 is maintained regardless of the gate voltage. In terms of the total capacitance of the semiconductor device 100 including the wiring capacitor 5, the voltage dependence can be reduced compared to a conventional device.

When the gate voltage equal to or higher than the threshold voltage "Vt" is applied to the MOS capacitor 4, and a channel is formed, capacitances in the gate insulating films 10 and 11 are, respectively, formed between the $p^+$ diffusion layers 7 and 8, which are commonly connected, and the gate electrode 12 of one of the MOS structures and between the $p^+$ diffusion layers 8 and 9, which are commonly connected, and the gate electrode 13 of the other MOS structure. Accordingly, the capacitance "C" of the MOS capacitor 4 is almost equal to those of the gate insulating films 10 and 11. Thus, the total capacitance of the semiconductor device 100 becomes almost equal to the sum of the capacitances of the gate insulating films 10 and 11 and that of the wiring capacitor 5.

As described above, the semiconductor device 100 can increase the capacitance and reduce the voltage dependence, compared to a conventional device.

The frequency characteristic of the semiconductor device 100 with the above-described configuration will be explained next.

If the power supply frequency of the MOS capacitor 4 is low, a sufficient number of carriers are accumulated in an inversion layer by switching between the on and off states of the MOS capacitor 4, and a capacitance is generated in the inversion layer. Thus, the total capacitance of the semiconductor device 100 becomes almost equal to the sum of the capacitances of the gate insulating films 10 and 11 and that of the wiring capacitor 5.

On the other hand, if the power supply frequency of the MOS capacitor 4 is high, switching between the on and off states of the MOS capacitor 4 is too rapid to allow accumulation of carries in the inversion layer, and no capacitance is generated in the inversion layer. In the meantime, a capacitance formed in the wiring capacitor 5 is maintained regardless of the power supply frequency. In terms of the total capacitance of the semiconductor device 100 including the wiring capacitor 5, the frequency characteristic can be improved compared to a conventional device.

An example will be explained here where the semiconductor device 100 is applied to a charge pump circuit.

Figure 4:
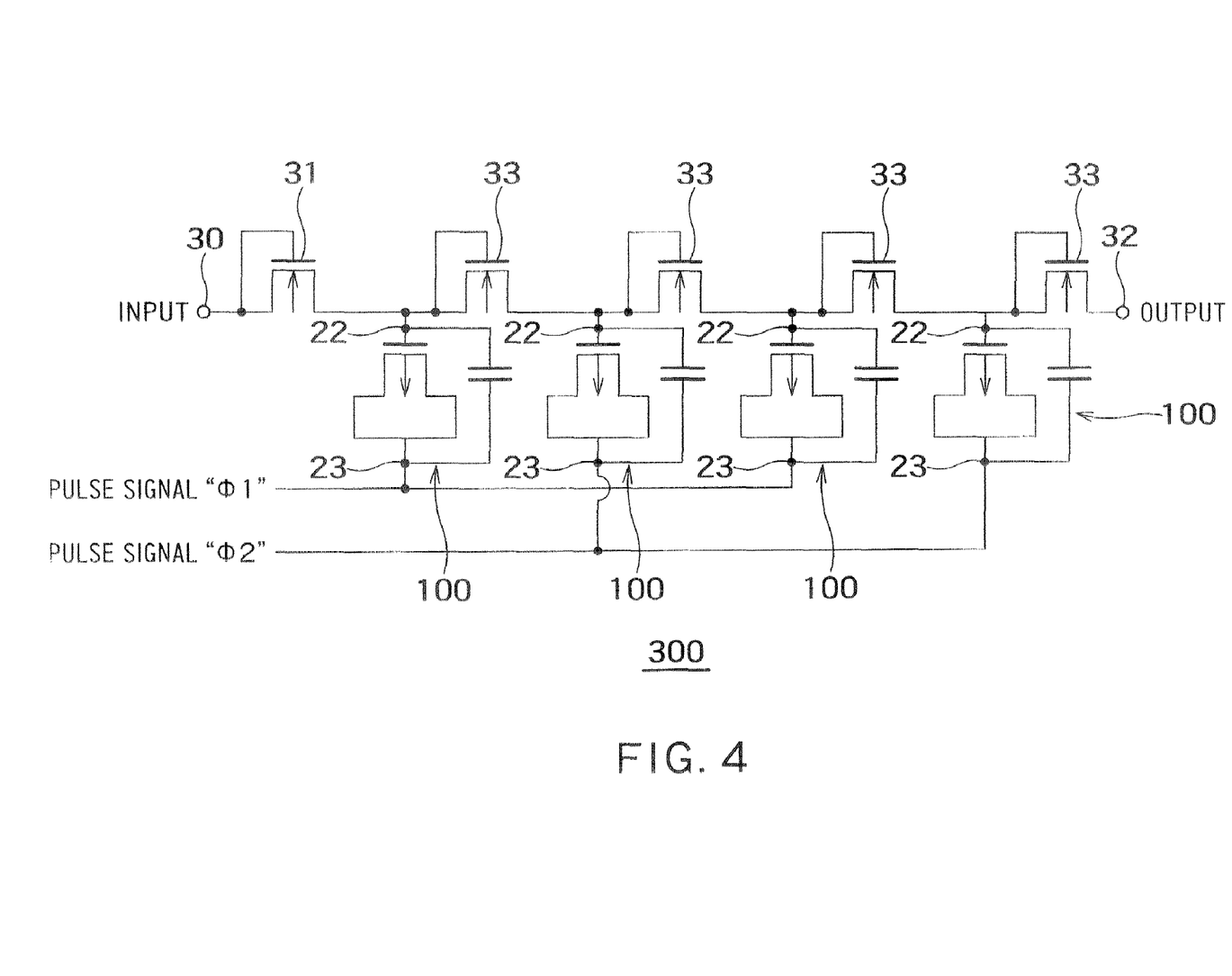
FIG. 4 is a circuit diagram showing a charge pump circuit to which the semiconductor device according to the first embodiment is applied.

FIG. 4 is a circuit diagram showing a charge pump circuit 300 to which the semiconductor device according to the first embodiment is applied.

As shown in FIG. 4, the charge pump circuit 300 includes an input MOS transistor 31 having a source region connected to an input terminal 30 to which a power supply voltage is applied and having a gate electrode connected to the source region, a plurality of boost MOS transistors 33 series-connected between the drain region of the input MOS transistor 31 and an output terminal 32 from which a boosted voltage is output and having gate electrodes connected to respective source regions, and the semiconductor devices 100 having the terminals 22 (the first comb-shaped wiring 16 in FIG. 2) connected to the respective sources of the boost MOS transistors 33.

Pulse signals "Φ1" and "Φ2" which are complementary to each other are input to the terminals 23 (the second comb-shaped wiring 17 in FIG. 2) of respective adjacent ones of the semiconductor devices 100.

When the power supply voltage is applied to the input terminal, and the complementary clock signals "Φ1" and "Φ2" are input to the terminals 23, the charge pump circuit 300 performs boosting operation and outputs a boosted voltage from the output terminal 32.

As described above, in the semiconductor device 100, the voltage dependence of capacitance is reduced, and the frequency characteristic is improved, compared to a conventional MOS capacitor. Thus, the charge pump circuit 300 with the above-described configuration can reduce the voltage dependence of a capacitance value, improve the frequency characteristic of the capacitance value, and improve the boost performance, compared to a conventional circuit.

As has been described above, according to the semiconductor device of this embodiment, it is possible to improve the frequency characteristic of a capacitance value while reducing the voltage dependence of the capacitance value.

SECOND EMBODIMENT

The first embodiment has described a case where the number of comb-shaped wiring layers of the wiring capacitor is one. This embodiment will describe a case where the number of comb-shaped wiring layers of a wiring capacitor is more than one.

Figure 5:
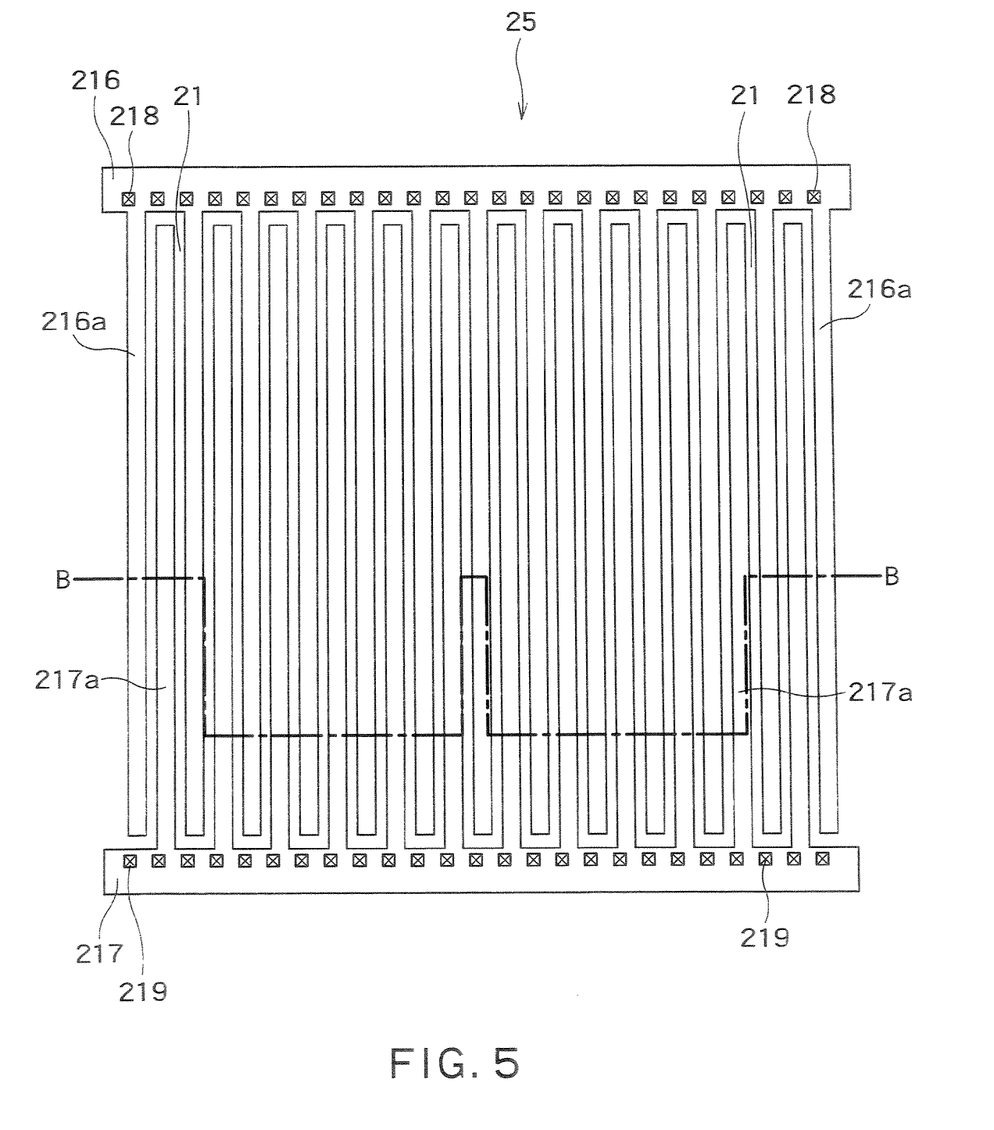
FIG. 5 is a plan view showing the configuration of the main portion of a wiring capacitor of a semiconductor device according to a second embodiment of the present invention.
Figure 6:
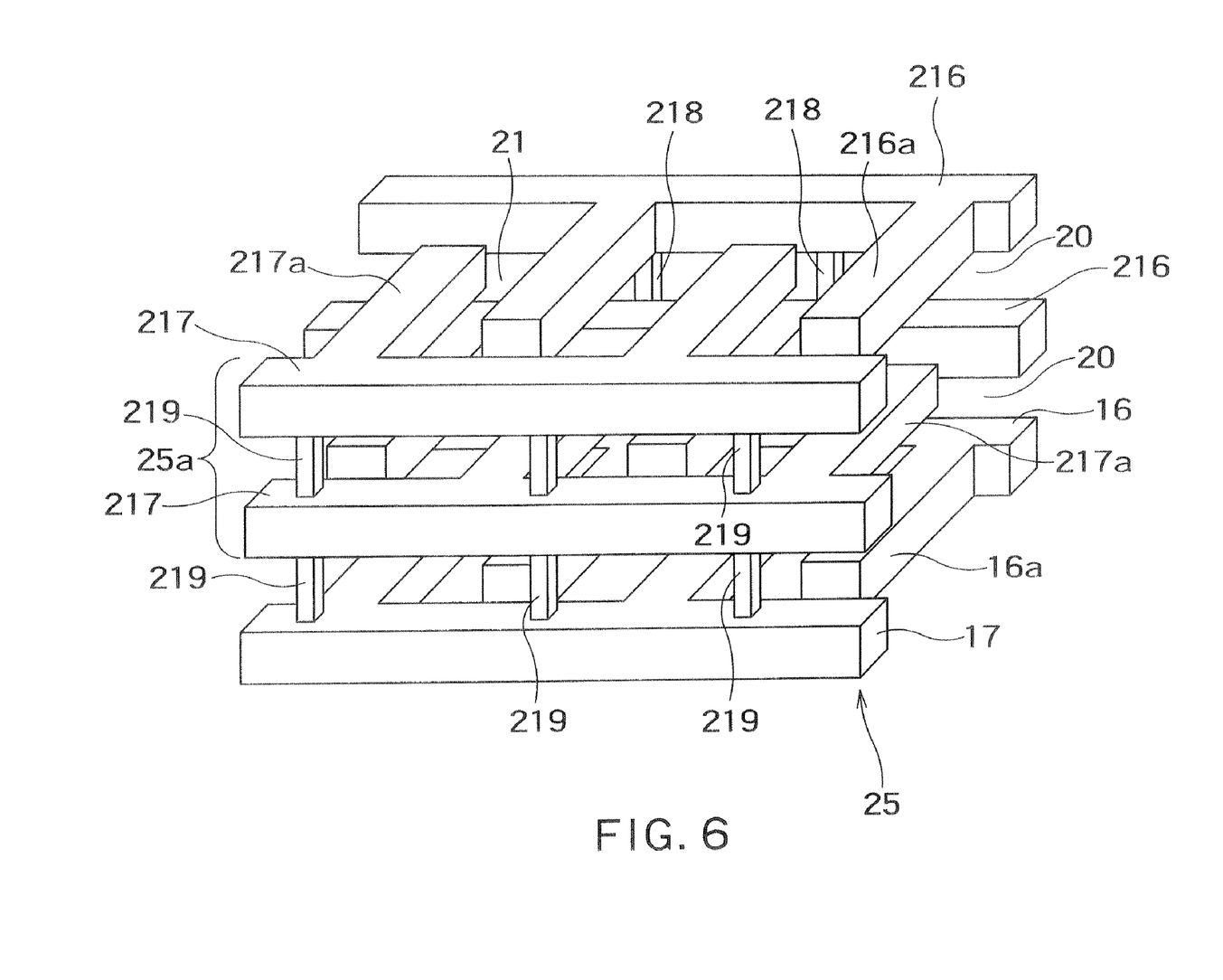
FIG. 6 is a perspective view showing the configuration of the main portion of the wiring capacitor in FIG. 5.
Figure 7:
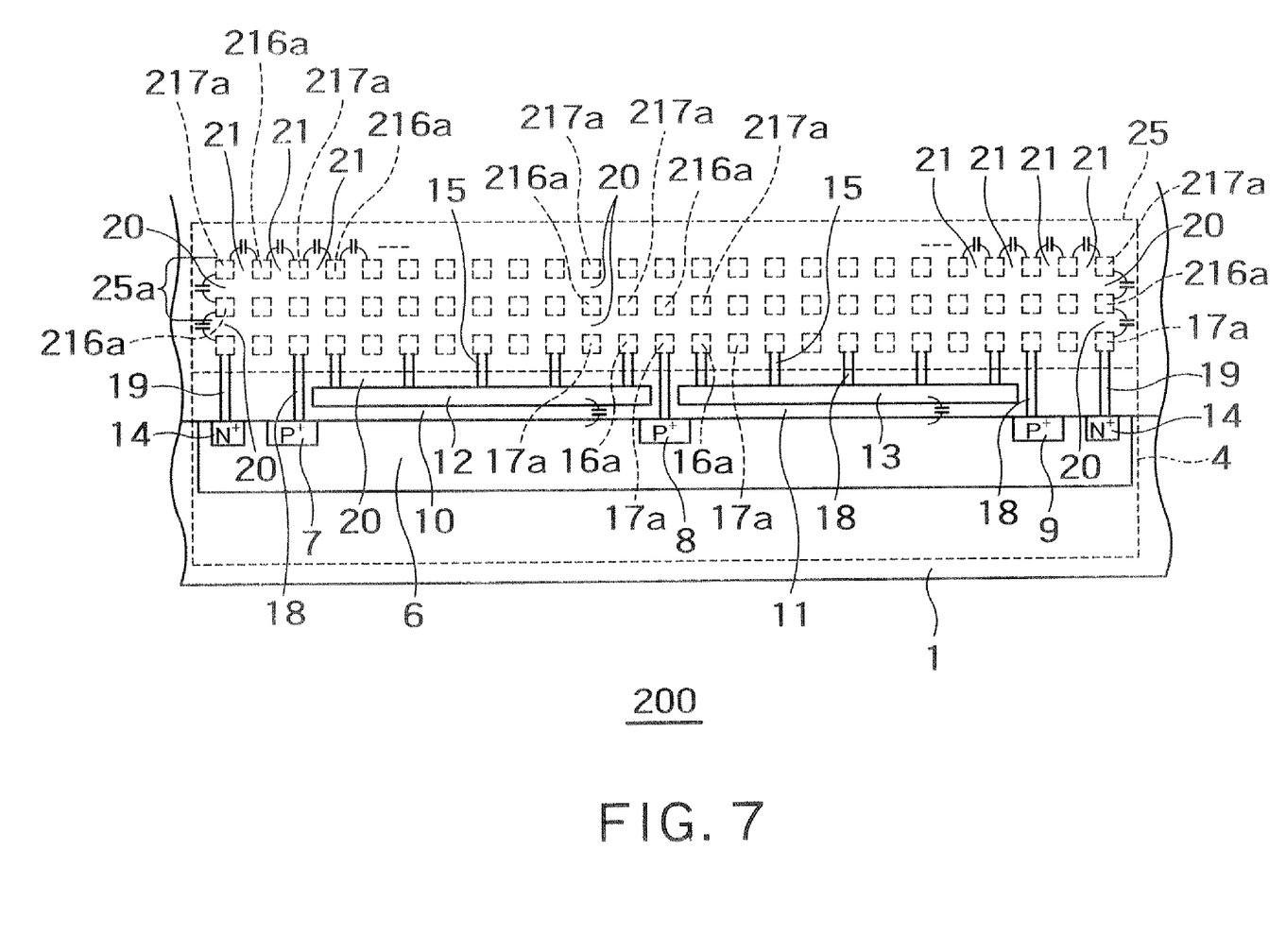
FIG. 7 is a sectional view showing a section taken along the line B-B in FIG. 5 of a semiconductor device according to the second embodiment of the present invention.

FIG. 5 is a plan view showing the configuration of the main portion of a wiring capacitor of a semiconductor device according to a second embodiment of the present invention. FIG. 6 is a perspective view showing the configuration of the main portion of the wiring capacitor in FIG. 5. FIG. 7 is a sectional view showing a section taken along the line B-B in FIG. 5 of a semiconductor device 200 according to the second embodiment of the present invention. It should be noted that the same reference numerals as those in the first embodiment denote the same parts. In FIG. 5, the lower layer side of a wiring capacitor will be omitted for convenience of explanation.

As shown in FIGS. 5 to 7, the semiconductor device 200 includes a MOS capacitor 4 composed of MOS structures formed on a p-type semiconductor substrate 1 and a wiring capacitor 25 provided on the MOS capacitor 4.

As shown in FIGS. 6 and 7, the wiring capacitor 25 has a first comb-shaped wiring 16 that is formed on the MOS capacitor 4 through an interlayer insulating film 20, is connected to gate electrodes 12 and 13 of the MOS capacitor 4 through contacts 15, and has projecting portions 16a projecting like comb teeth.

The wiring capacitor 25 also has a second comb-shaped wiring 17 that is formed on the MOS capacitor 4 through the interlayer insulating film 20, is arranged across an inter-line insulating film 21 from the first comb-shaped wiring 16, is connected to $p^+$ diffusion layers 7, 8, and 9 and an n+ diffusion layer 14 through a plurality of contacts 18 and 19, and has projecting portions 17a projecting like comb teeth.

The wiring capacitor 25 further has third comb-shaped wirings 216, each of which is formed on the first comb-shaped wiring 16 through the interlayer insulating film 20, is connected to the first comb-shaped wiring 16 through contacts 218, and has projecting portions 216a projecting like comb teeth.

The wiring capacitor 25 further has fourth comb-shaped wirings 217, each of which is formed on the second comb-shaped wiring 17 through the interlayer insulating film 20, is arranged across the inter-line insulating film 21 from the corresponding third comb-shaped wiring 216, is connected to the second comb-shaped wiring 17 through contacts 219, and has projecting portions 217a projecting like comb teeth.

In other words, the wiring capacitor 25 further has a multilayer wiring layer 25a in which the pairs of third and fourth comb-shaped wirings 216 and 217 are alternatively stacked through the interlayer insulating films 20 compared to the wiring capacitor 5 of the first embodiment.

As shown in FIGS. 5 to 7, the projecting portions 217a of each fourth comb-shaped wiring 217 and the projecting portions 216a of the corresponding third comb-shaped wiring 216 are alternately arranged. Each pair of comb-shaped wirings, i.e., the third comb-shaped wiring 216 and the fourth comb-shaped wiring 217 are arranged within a single wiring layer. This structure brings the projecting portions 216a of the third comb-shaped wiring 216 and the projecting portions 217a of the fourth comb-shaped wiring 217 closer to each other. The capacitance of the inter-line insulating film 21 between the projecting portions 216a and the projecting portions 217a can be increased.

As described above, the projecting portions 16a of the first comb-shaped wiring 16 are located below the projecting portions 217a of the fourth comb-shaped wiring 217 through the interlayer insulating film 20, and the projecting portions 216a of the third comb-shaped wiring 216 are located above the projecting portions 217a of the fourth comb-shaped wiring 217 through the interlayer insulating film 20.

Accordingly, the capacitance of the wiring capacitor 25 is considered to include the capacitances of the interlayer insulating films 20.

The circuit diagram of the semiconductor device 200 with the above-described configuration is as shown in FIG. 3, as in the first embodiment.

The frequency characteristic and voltage dependence of the semiconductor device 200 with the above-described configuration are the same as those of the first embodiment except that the capacitance of the wiring capacitor 25 increases.

As has been described above, according to the semiconductor device of this embodiment, it is possible to reduce the voltage dependence of a capacitance value, improve the frequency characteristic of the capacitance value, and obtain a larger capacitance than the first embodiment.

It should be noted that application of this embodiment to a charge pump circuit like the first embodiment also makes it possible to reduce the voltage dependence of a capacitance value, improve the frequency characteristic of the capacitance value, and improve the boost performance, compared to a conventional circuit.

This embodiment has explained a case where the multilayer wiring layer with comb-shaped wirings of the wiring capacitor consists of two layers. Formation of the multilayer wiring layer by stacking three or more layers makes it possible to obtain a larger capacitance while more effectively maintaining the layout area.

What is claimed is:

1. A semiconductor device comprising:
    a MOS capacitor in which a drain region and a source region of a MOS structure are commonly connected, and a capacitance is formed between the commonly connected drain region/source region and a gate electrode of the MOS structure; and
    a wiring capacitor which has a first comb-shaped wiring that is formed on said MOS capacitor through an interlayer insulating film, is connected to the gate electrode of said MOS capacitor, and has projecting portions projecting like comb teeth and a second comb-shaped wiring that is formed on said MOS capacitor through the interlayer insulating film, is arranged across an inter-line insulating film from the first comb-shaped wiring, is connected to the drain region and source region, and has projecting portions projecting like comb teeth,
    wherein the projecting portions of the second comb-shaped wiring are arranged alternately with the projecting portions of the first comb-shaped wiring and arranged perpendicularly to a channel direction connecting the drain region and source region of said MOS capacitor, and
    the MOS structure has a first conductivity type well formed on a second conductivity type semiconductor substrate, second conductivity type diffusion layers serving as the drain region and the source region which are selectively formed in the surface of the first conductivity type well, a gate insulating film provided on a region between the second conductivity type diffusion layers, the gate electrode provided on the gate insulating film, and a first conductivity type diffusion layer for applying a voltage to a back gate which is formed in the first conductivity type well so as to surround the second conductivity type diffusion layers.

2. The semiconductor device according to claim 1, wherein the first comb-shaped wiring and the second comb-shaped wiring are arranged within a single wiring layer.

3. The semiconductor device according to claim 2, wherein said wiring capacitor further has a multilayer wiring layer formed by stacking, through an interlayer insulating film, a third comb-shaped wiring that is formed on the first comb-shaped wiring through an interlayer insulating film, is connected to the first comb-shaped wiring through a contact, and has projecting portions projecting like comb teeth and a fourth comb-shaped wiring that is formed on the second comb-shaped wiring through the interlayer insulating film, is arranged across an inter-line insulating film from the third comb-shaped wiring, is connected to the second comb-shaped wiring through a contact, and has projecting portions projecting like comb teeth,
    wherein the projecting portions of the fourth comb-shaped wiring are arranged alternately with the projecting portions of the third comb-shaped wiring.

4. The semiconductor device according to claim 3, wherein the third comb-shaped wiring and the fourth comb-shaped wiring are arranged within a single wiring layer.

5. The semiconductor device according to claim 4, wherein the multilayer wiring layer is made by a plurality of the pairs of the third comb-shaped wirings and the fourth comb-shaped wirings are stacked through interlayer insulating films.

6. The semiconductor device according to claim 1, wherein the projecting portions of the second comb-shaped wirings are connected to the drain region and source region through a plurality of contacts.

7. A charge pump circuit comprising:
    semiconductor devices each comprising a MOS capacitor in which a drain region and a source region of a MOS structure are commonly connected, and a capacitance is formed between the commonly connected drain region/source region and a gate electrode of the MOS structure and a wiring capacitor which has a first comb-shaped wiring that is formed on the MOS capacitor through an interlayer insulating film, is connected to the gate electrode of the MOS capacitor, and has projecting portions projecting like comb teeth and a second comb-shaped wiring that is formed on the MOS capacitor through the interlayer insulating film, is arranged across an inter-line insulating film from the first comb-shaped wiring, is connected to the drain region and source region, and has projecting portions projecting like comb teeth, the projecting portions of the second comb-shaped wiring being arranged alternately with the projecting portions of the first comb-shaped wiring and arranged perpendicularly to a channel direction connecting the drain region and source region of the MOS capacitor;

an input MOS transistor having a source region connected to an input terminal to which a power supply voltage is applied; and a plurality of boost MOS transistors which are series-connected between a drain region of said input MOS transistor and an output terminal from which a boosted voltage is output, wherein the first comb-shaped wirings are connected to respective source regions of said boost MOS transistors, pulse signals which are complementary to each other are input to the second comb-shaped wirings of respective adjacent ones of said semiconductor devices, and the MOS structures have a first conductivity type well formed on a second conductivity type semiconductor substrate, second conductivity type diffusion layers serving as the drain region and the source region which are selectively formed in the surface of the first conductivity type well, a gate insulating film provided on regions between the second conductivity type diffusion layers, the gate electrode provided on the gate insulating film, and a first conductivity type diffusion layer for applying a voltage to a back gate which is formed in the first conductivity type well so as to surround the second conductivity type diffusion layers.

8. The charge pump circuit according to claim 7, wherein the first comb-shaped wiring and the second comb-shaped wiring are arranged within a single wiring layer.

9. The charge pump circuit according to claim 8, wherein said wiring capacitor further has a multilayer wiring layer formed by stacking, through an interlayer insulating film, a third comb-shaped wiring that is formed on the first comb-shaped wiring through an interlayer insulating film, is connected to the first comb-shaped wiring through a contact, and has projecting portions projecting like comb teeth and a fourth comb-shaped wiring that is formed on the second comb-shaped wiring through the interlayer insulating film, is arranged across an inter-line insulating film from the third comb-shaped wiring, is connected to the second comb-shaped wiring through a contact, and has projecting portions projecting like comb teeth, wherein the projecting portions of the fourth comb-shaped wiring are arranged alternately with the projecting portions of the third comb-shaped wiring.

10. The charge pump circuit according to claim 9, wherein the third comb-shaped wiring and the fourth comb-shaped wiring are arranged within a single wiring layer.

11. The charge pump circuit according to claim 10, wherein the multilayer wiring layer is made by a plurality of the pairs of the third comb-shaped wirings and the fourth comb-shaped wirings are stacked through interlayer insulating films.

12. The charge pump circuit according to claim 7, wherein the projecting portions of the second comb-shaped wirings are connected to the drain region and source region through a plurality of contacts.

* * * * *